United States Patent [19]

Kurasawa et al.

[11] Patent Number: 5,416,662
[45] Date of Patent: May 16, 1995

[54] CHIP-TYPE SURGE ABSORBER

[76] Inventors: Koichi Kurasawa; Takaaki Ito, both of c/o Ceramic Laboratory, Mitsubishi Materials Corporation, 2270 Ooaza Yokoze, Yokozemachi, Chichibu-gun, Saitama-ken, Japan

[21] Appl. No.: 71,751

[22] Filed: Jun. 9, 1993

[30] Foreign Application Priority Data

Jun. 10, 1992 [JP] Japan ................................. 4-176124

[51] Int. Cl.⁶ .............................................. H02H 9/04
[52] U.S. Cl. ...................................... 361/118; 361/56; 361/41; 361/111; 361/127
[58] Field of Search ................. 361/56, 91, 111, 118, 361/705, 708, 712, 713, 723, 813, 709, 707, 722, 127; 257/684, 688, 675, 676, 692, 778, 796, 690, 692, 698, 736, 777, 784

[56] References Cited

U.S. PATENT DOCUMENTS

| | | | |
|---|---|---|---|
| 4,600,960 | 7/1986 | Clark | 361/111 |
| 5,075,759 | 12/1991 | Moline | 361/813 |
| 5,150,271 | 9/1992 | Unterweger et al. | 361/111 |

*Primary Examiner*—Jeffrey A. Gaffin
*Assistant Examiner*—Ronald W. Leja
*Attorney, Agent, or Firm*—Harold L. Burstyn; Thomas R. Morrison

[57] ABSTRACT

A single three-terminal chip-type surge absorber combines two or three semiconductor surge-absorbing elements with three electrode plates and resin-molding the combination. When more lines must be connected to an electronic device subject to a voltage surge, instead of mounting a plurality of surge-absorbing elements, which requires a substantial space and many mounting steps, a single surge absorber with a plurality of surge absorbing elements absorbs the voltage surge.

23 Claims, 3 Drawing Sheets

CHIP-TYPE SURGE ABSORBER

BACKGROUND OF THE INVENTION

The present invention relates to a surge absorber installed in an electronic device or other electrical apparatus that a voltage surge can damage. The surge absorber comprises a semiconductor surge-absorbing element that can prevent a malfunction of the electronic device caused by a voltage surge. More particularly, the present invention relates to a chip-type surge absorber adapted to be mounted directly on the surface of a printed circuit board.

A surge absorber is usually connected to a pair of input lines of an electronic component of a communication or electronic device. The surge absorber operates at a voltage higher than the service voltage of the electronic component. More specifically, the surge absorber is a resistor that in normal operation has a high resistance at any voltage lower than its service voltage. When an impressed voltage becomes higher than the service voltage, the resistance of the surge absorber drops to no more than several tens of ohms. Thus, when a voltage surge, as from a nearby lightning bolt, is applied to a surge absorber protecting an electronic component, the surge absorber is instantaneously actuated to absorb the voltage surge. This actuation prevents the voltage surge from traveling through the electronic component, thereby preventing the voltage surge from causing damage to the electronic component.

A surface-mounted chip-type surge absorber is known that employs a semiconductor surge-absorbing element, generally a thyristor. This surge absorber comprises, in addition to the semiconductor surge-absorbing element, a pair of electrode plates and a resin body. The resin body covers the surge-absorbing element and leaves exposed each of the terminals of the electrode plates. One end of each electrode plate is connected to each of upper and lower electrode surfaces of the surge-absorbing element. Since the other ends of the electrode plates are located on a plane, this surge absorber can be mounted directly on the surface of a substrate.

In the surge-absorbing circuit of a communication line such as a telephone circuit, a surge absorber is connected between the input lines, and a plurality of surge absorbers dissipate any voltage surge impressed on either one of the input lines.

For example, a chip-type surge absorber is generally connected to a pair of input lines that are in turn connected to an electronic component. When a surge-absorbing circuit uses a surge absorber that incorporates a conventional single-semiconductor surge-absorbing element, two or three surge absorbers must be mounted on the substrate. Mounting a plurality of surge absorbers rather than one requires both a larger area for mounting and more installation labor.

OBJECTS AND SUMMARY OF THE INVENTION

An object of the present invention is to provide, for multiple lines requiring a plurality of surge-absorbing elements, a chip-type surge absorber that does not require a wide area for mounting on a printed circuit board.

A further object of the present invention is to provide, for multiple lines requiring a plurality of surge-absorbing elements, a chip-type surge absorber that can be mounted in a few simple steps.

To achieve these objects, the chip-type surge absorber of the present invention comprises a first electrode plate with a partially exposed projection at the center, two semiconductor surge-absorbing elements, a second and a third electrode plate, and a resin body that covers the two semiconductor surge-absorbing elements and the three electrode plates. One of the electrode surfaces of each surge-absorbing element is connected to the upper surface of each of the two ends of the first electrode plate. One end of each of the second and third electrode plates is connected to the other electrode surface of the respective surge-absorbing elements. The other ends of the second and third electrode plates are located on the same plane as the partially-exposed projection of the first electrode plate.

The chip-type surge absorber of the present invention can also be constructed in another way. One electrode surface of a third semiconductor surge-absorbing element is connected to an end of the third electrode plate. The other electrode surface of the third semiconductor surge-absorbing element is connected to an end of the second electrode plate by a conductive member. The resin body covers the three surge absorbing elements and the conductive member.

Briefly stated, the present invention provides a single three-terminal chip-type surge absorber made by combining two or three semiconductor surge-absorbing elements with three electrode plates and resin-molding the combination. When more lines must be connected to an electronic device subject to a voltage surge, instead of mounting a plurality of surge-absorbing elements, which requires a substantial space and many mounting steps, a single surge absorber with a plurality of surge absorbing elements absorbs the voltage surge.

According to an embodiment of the invention, a chip-type surge absorber comprises: a first electrode plate having a projection at its center; said first electrode plate having further a first and a second end; a first and a second semiconductor surge-absorbing element; said first and said second semiconductor surge-absorbing element having each a first electrode surface connected to an upper surface of said first electrode plate at respectively said first and said second end thereof; a second electrode plate having a first end connected to a second electrode surface of said first semiconductor surge-absorbing element; said second electrode plate being formed so that a second end thereof is located in the same plane as said projection; a third electrode plate having a first end connected to a second electrode surface of said second semiconductor surge-absorbing element; said third electrode plate being formed so that a second end thereof is located in the same plane as said projection; and a resin body covering said first and said second semiconductor surge-absorbing element while exposing said projection, said second end of said second electrode plate, and said second end of said third electrode plate.

According to a feature of the invention, a chip-type surge absorber comprises: a first electrode plate having a projection at its center; said first electrode plate having further a first and a second end; a first and a second semiconductor surge-absorbing element; said first and said second semiconductor surge-absorbing element having each a first electrode surface connected to an upper surface of said first electrode plate at respectively said first and said second end thereof; a second electrode plate having a first end connected to a second electrode surface of said first semiconductor surge-absorbing element; said second electrode plate being formed so that a second end thereof is located in the same plane as said projection; a third electrode plate having a first end connected to a second electrode surface of said second semiconductor surge-absorbing element; said third electrode plate being formed so that a second end thereof is located in the same plane as said projection; a third semiconductor surge-absorbing element; said third semiconductor surge-absorbing element having a first electrode surface connected to an end of a one of said second and said third electrode plate; a second electrode surface of said third semiconductor surge-absorbing element and said first end of a one of said third and said second electrode plate being connected by a conductive member; and a resin body covering said first, said second, and said third semiconductor surge-absorbing element and said conductive member while exposing said projection, said second end of said second electrode plate, and said second end of said third electrode plate.

According to another feature of the invention, a method of making a chip-type surge absorber comprises: a first connecting step of connecting an upper surface at a first and a second end of a first electrode plate having a projection at its center to a first electrode surface of respectively a first and a second semiconductor surge-absorbing element; a second connecting step of connecting each of a second and a third electrode plate at a first end thereof to a second electrode surface of respectively said first and said second semiconductor surge-absorbing element; said first and second connecting steps forming a combination body; placing said combination body into a mold constructed so that said projection and a second end of each of said second and said third electrode plates remain outside said mold; pouring a sealing resin into said mold; curing said resin; and removing said mold.

The above, and other objects, features, and advantages of the present invention will become apparent from the following description read in conjunction with the accompanying drawings, in which like reference numerals designate the same elements.

DETAILED DESCRIPTION OF THE PREFERRED EMBODIMENTS

Figure 5:
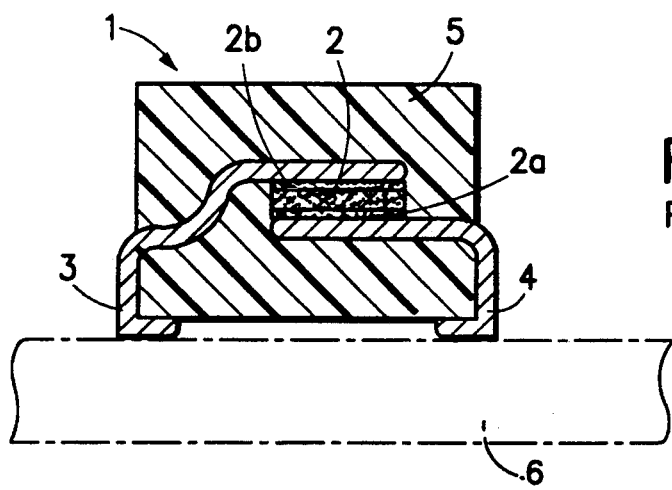
FIG. 5 is a sectional view of a conventional chip-type surge absorber.

Referring to FIG. 5, a surge absorber 1 comprises a semiconductor surge-absorbing element 2 of a thyristor structure, a pair of electrode plates 3 and 4, and a resin body 5 that covers surge-absorbing element 2 except for terminals of electrode plates 3 and 4. One end of each of electrode plates 3 and 4 is connected to each of a lower electrode surface 2a and an upper electrode surface 2b of surge-absorbing element 2. Since the other ends of the electrode plates 3 and 4 are located on a plane, surge absorber 1 can be mounted directly on the surface of a substrate 6.

In a surge-absorbing circuit of a communication line, such as a telephone line, a surge absorber is connected between a pair of input lines. A plurality of surge absorbers permits absorption of a voltage surge impressed on either one of the pair of input lines.

Figure 6:
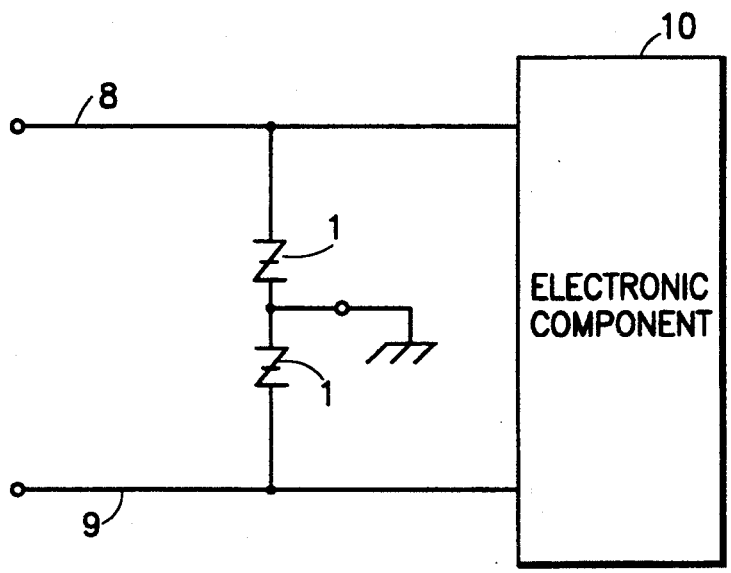
FIG. 6 is a diagram of a surge-absorbing circuit of a communication line.

As shown in FIG. 6, for example, when a pair of input lines 8 and 9 are connected to an electronic component 10, a chip-type surge absorber 1 can be connected between input lines 8 and 9.

Figure 7:
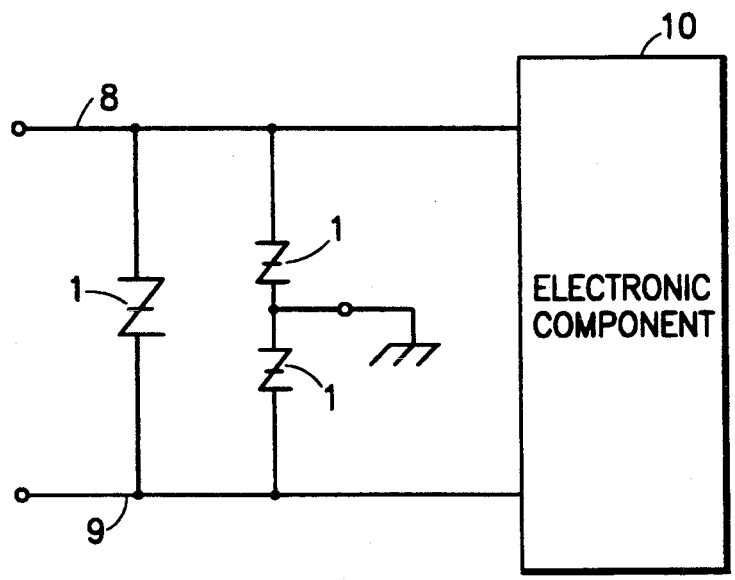
FIG. 7 is a diagram of another surge-absorbing circuit of a communication line.

Referring to FIGS. 6 and 7, when a surge-absorbing circuit incorporates conventional single-semiconductor surge-absorbing elements, two or three surge absorbers must be mounted on the substrate. Mounting of more than one surge absorber requires a substantial area and a number of steps for mounting.

The semiconductor surge-absorbing element of the present invention should preferably be a relatively compact silicon surge-absorbing element with a high surge-current capacity. The available types of silicon surge-absorbing elements include the two-way type, the unilateral type, and the reverse blocking type. The two-way type of silicon surge-absorbing element is preferred because it occupies the least space.

There is a preferred method of covering, by a resin body, a plurality of surge-absorbing elements and electrode plates that are connected together. After the surge-absorbing elements and the electrode plates are soldered together, the combination is placed into a mold. A sealing resin is poured over the combination. After the object in the mold is cured by heat, the mold is removed. An epoxy resin is preferred. Though the surge-absorbing elements and the electrode plates are usually soldered together, they may be connected by any suitable conductive adhesive.

According to the present invention, a single surface-mounting chip-type surge absorber incorporates a plurality of semiconductor surge-absorbing elements with both terminal electrodes and an intermediate electrode exposed on the bottom surface. Thus, even when two or three surge-absorbing elements are required, for example, in a surge-absorbing circuit such as a telephone line, it suffices to mount a single surge absorber of the present invention. Consequently, compared with a plurality of conventional surge-absorbing elements, the single surge absorber of the present invention requires less area for mounting on the surface of the substrate and fewer steps for mounting components.

EXAMPLE 1

Figure 1:
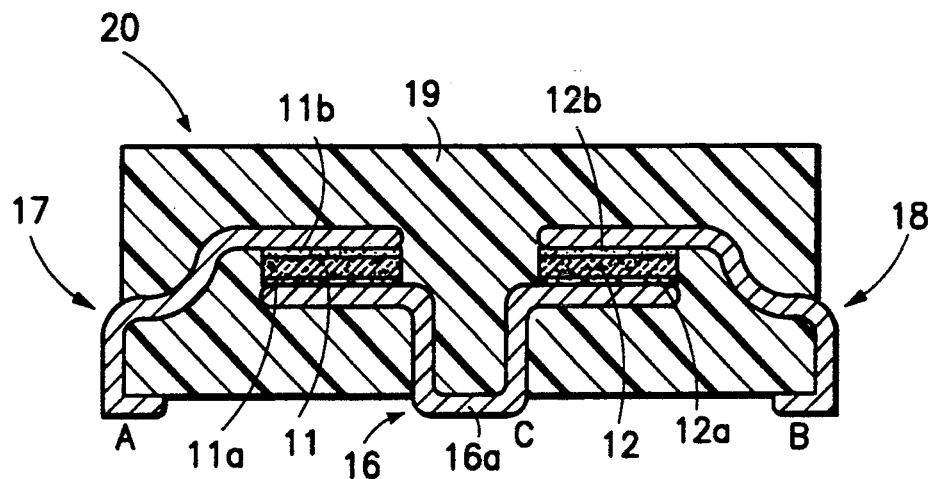
FIG. 1 is a sectional view of a first embodiment of a chip-type surge absorber of the present invention.

Referring to FIG. 1, first and second two-way semiconductor surge-absorbing elements 11 and 12, each about 3 mm long, about 3 mm wide, and about 1 mm thick, were prepared. Each of surge-absorbing elements 11 and 12 had a thyristor constructed of silicon semiconductor. Surge-absorbing element 11 had a lower electrode surface 11a and an upper electrode surface 11b. Surge-absorbing element 12 had a lower electrode surface 12a and an upper electrode surface 12b. A first electrode plate 16 had a projection 16a at the center and a cross-section shaped like an inverted hat. Surge-absorbing elements 11 and 12 were placed on an upper surface of first electrode plate 16 at its respective ends. Electrode surface 11a and electrode surface 12a were soldered to first electrode plate 16.

After fixing first electrode plate 16, with surge-absorbing elements 11 and 12 connected thereto by a fitting (not shown), a lower surface at an end of a second electrode plate 17 was soldered to upper electrode surface 11b. A lower surface at an end of a third electrode plate 18 was soldered to upper electrode surface 12b. Second and third electrode plates 17 and 18 each had the same width as first electrode plate 16. Second and third electrode plates 17 and 18 were bent to be horizontally symmetrical where they were connected to surge-absorbing elements 11 and 12. Ends of electrode plates 17 and 18 away from the connections to surge-absorbing elements 11 and 12 were bent to lie in the same plane as a projection 16a of the first electrode plate 16.

The combination of surge-absorbing elements 11 and 12 and electrode plates 16, 17, and 18 was placed in a mold (not shown) having the following inside dimensions: a length of about 5 mm, a width of about 10 mm, and a height of about 3 mm. An epoxy resin was poured into the mold. After curing the resin and removing the mold, a surge absorber 20 was obtained. Referring again to FIG. 1, the mold had previously been formed so that terminal electrodes A and B were exposed from both side surfaces to the bottom surface of a resin body 19, and an intermediate electrode C was exposed at the center of the bottom surface of resin body 19. The terminal electrodes A and B corresponded to the ends of second and third electrode plates 17 and 18 opposite where surge-absorbing elements 11 and 12 were connected. The intermediate electrode C corresponded to the projection 16a.

Figure 2:
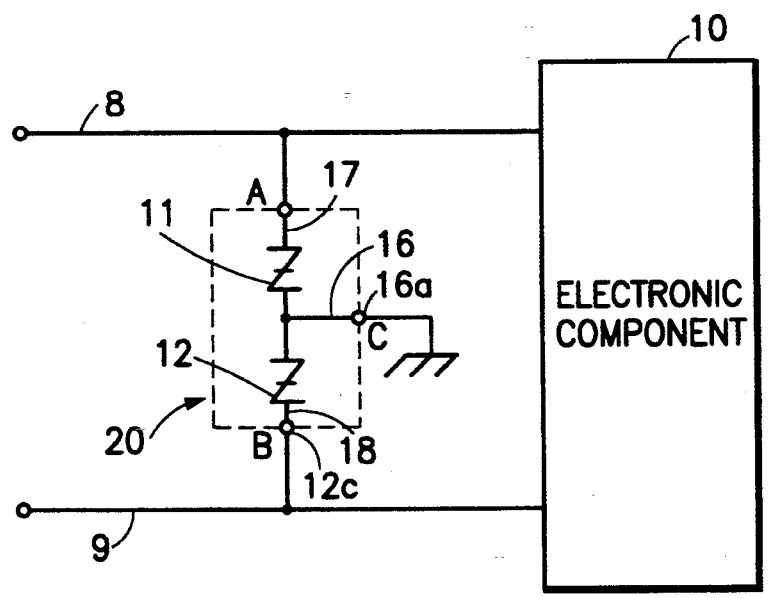
FIG. 2 is a diagram of a surge-absorbing circuit, equivalent to the circuit shown in FIG. 6, that uses the surge absorber shown in FIG. 1.

Referring to FIG. 2, surge absorber 20 was connected to a circuit comprising an electronic component 10 connected to a pair of input lines 8 and 9. It was possible to form a circuit equivalent to the surge-absorbing circuit shown in FIG. 6 by connecting terminal electrodes A and B and intermediate electrode C to a substrate (not shown).

EXAMPLE 2

Figure 3:
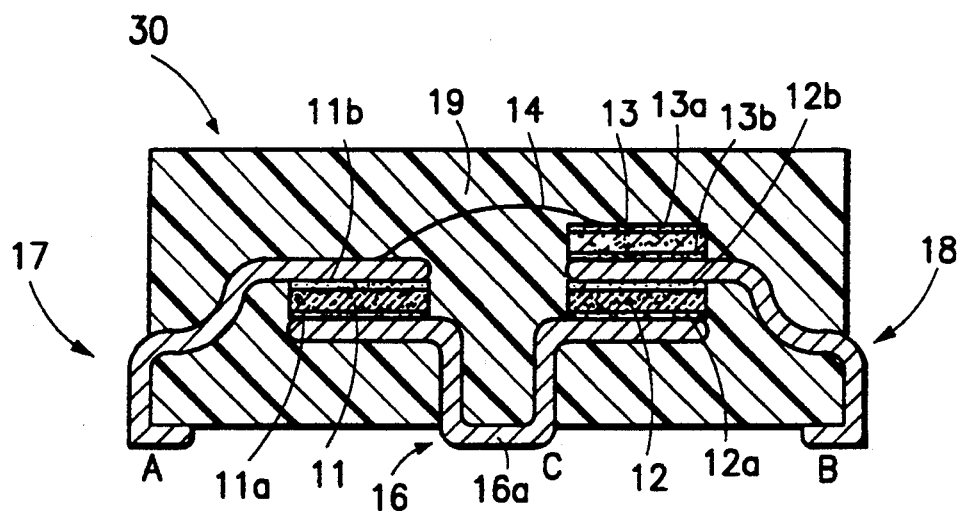
FIG. 3 is a sectional view of another embodiment of the chip-type surge absorber of the present invention.
Figure 4:
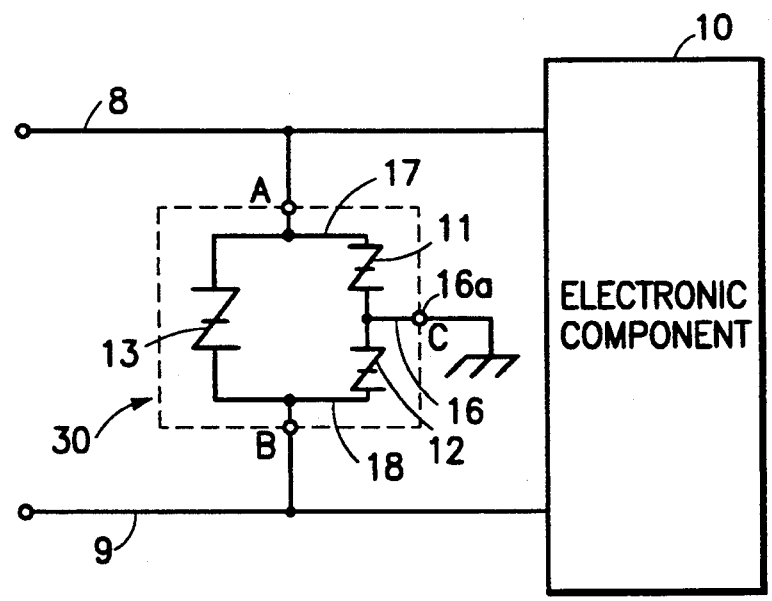
FIG. 4 is a diagram of a surge-absorbing circuit, equivalent to the circuit shown in FIG. 7, that uses the surge absorber shown in FIG. 3.

Referring to FIG. 3, a combination comprising two surge-absorbing elements and three electrode plates was prepared in the same manner as in Example 1. A lower electrode surface 13b of a third surge-absorbing element 13 (the latter of the same construction as first and second surge-absorbing elements 11 and 12) was soldered to an upper surface at an end of third electrode plate 18 opposite terminal electrode B. An upper electrode surface 13a of third surge-absorbing element 13 was connected by a conductive member 14 (a wire) to an upper surface of the second electrode plate 17 at an end opposite terminal electrode A.

This combination with resin body 19 formed a surge absorber 30. In chip-type surge absorber 30, terminal electrodes A and B were exposed from both side surfaces to the bottom surface of resin body 19. Intermediate electrode C was exposed at the center of the bottom surface of resin body 19.

It was possible to form a circuit equivalent to the surge absorbing circuit shown in FIG. 7 by connecting terminal electrodes A and B and the intermediate electrode C to a substrate (not shown).

Surge absorber 30 may also be formed by connecting lower electrode surface 13b to an end of second electrode plate 17 and connecting upper electrode surface 13a and an end of third electrode plate 18 by means of conductive member 14. A wire, such as an aluminum or a copper wire, or a metal sheet, such as a copper sheet, may form conductive member 14.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A chip-type surge absorber, which comprises:
a first electrode plate having a projection at its center;
said first electrode plate having further a first and a second end;
a first and a second semiconductor surge-absorbing element;
said first and said second semiconductor surge-absorbing element having each a first electrode surface connected to an upper surface of said first electrode plate at respectively said first and said second end thereof;
a second electrode plate having a first end connected to a second electrode surface of said first semiconductor surge-absorbing element;
said second electrode plate being formed so that a second end thereof is located in the same plane as said projection;
a third electrode plate having a first end connected to a second electrode surface of said second semiconductor surge-absorbing element;
said third electrode plate being formed so that a second end thereof is located in the same plane as said projection; and
a resin body covering said first and said second semiconductor surge-absorbing element while exposing said projection, said second end of said second electrode plate, and said second end of said third electrode plate.

2. A chip-type surge absorber as in claim 1, wherein:
said first and said second semiconductor surge-absorbing element is a two-way type of silicon surge-absorbing element.

3. A chip-type surge absorber as in claim 1, wherein:
said first and said second semiconductor surge-absorbing element is a thyristor.

4. A chip-type surge absorber as in claim 1, wherein:
said resin body is epoxy resin.

5. A chip-type surge absorber as in claim 1, wherein:
said first and second electrode surfaces are connected by soldering.

6. A chip-type surge absorber as in claim 1, wherein:
said first and second electrode surfaces are connected by a conductive adhesive.

7. A chip-type surge absorber, which comprises:
a first electrode plate having a projection at its center;
said first electrode plate including a first and a second end;
a first and a second semiconductor surge-absorbing element;
said first and said second semiconductor surge-absorbing element having each a first electrode surface connected to an upper surface of said first electrode plate at respectively said first and said second end thereof;

a second electrode plate having a first end connected to a second electrode surface of said first semiconductor surge-absorbing element;

said second electrode plate being formed so that a second end thereof is located in the same plane as said projection;

a third electrode plate having a first end connected to a second electrode surface of said second semiconductor surge-absorbing element;

said third electrode plate being formed so that a second end thereof is located in the same plane as said projection;

a third semiconductor surge-absorbing element;

said third semiconductor surge-absorbing element having a first electrode surface connected to said first end of a one of said second and said third electrode plate;

a second electrode surface of said third semiconductor surge-absorbing element and said first end of another of said third and said second electrode plate being connected by a conductive member; and a resin body covering said first, said second, and said third semiconductor surge-absorbing element and said conductive member while exposing said projection, said second end of said second electrode plate, and said second end of said third electrode plate.

8. A chip-type surge absorber as in claim 7, wherein:
said first, said second and said third semiconductor surge-absorbing elements are two-way type silicon surge-absorbing element.

9. A chip-type surge absorber as in claim 7, wherein:
said first, said second, and said third semiconductor surge-absorbing elements are thyristors.

10. A chip-type surge absorber as in claim 7, wherein:
said resin body is an epoxy resin.

11. A chip-type surge absorber as in claim 7, wherein:
said first and second electrode surfaces are connected by soldering.

12. A chip-type surge absorber as in claim 7, wherein:
said first and second electrode surfaces are connected by a conductive adhesive.

13. A method of making a chip-type surge absorber, which comprises:
a first connecting step of connecting an upper surface at a first and a second end of a first electrode plate having a projection at its center to a first electrode surface of respectively a first and a second semiconductor surge-absorbing element;
a second connecting step of connecting each of a second and a third electrode plate, at a first end of said second electrode plate and at a first end of said third electrode plate respectively, to a second electrode surface of respectively said first and said second semiconductor surge-absorbing element;
said first and second connecting steps forming a combination body;
placing said combination body into a mold in which a second end of each of said second and said third electrode plates remain outside said mold;
pouring a sealing resin into said mold; and
curing said resin.

14. A method of making a chip-type surge absorber as in claim 13, further comprising:

a third connecting step of connecting a first electrode surface of a third semiconductor surge-absorbing element to an end of a one of said second and said third electrode plate;
a fourth connecting step of connecting a second electrode surface of said third semiconductor surge-absorbing element to said first end of a one of said third and said second electrode plate by a conductive member;
said third and said fourth connecting steps immediately following said second connecting step; and
said third and said fourth connecting steps preceding said steps of forming, placing, pouring, and curing.

15. A method of making a chip-type surge absorber as in claim 13, wherein said connecting steps include soldering.

16. A method of making a chip-type surge absorber as in claim 13, wherein said connecting steps include a conductive adhesive.

17. A method of making a chip-type surge absorber as in claim 13, wherein said step of pouring is carried out with an epoxy resin.

18. A method of making a chip-type surge absorber as in claim 14, wherein said connecting steps are carried out by soldering.

19. A method of making a chip-type surge absorber as in claim 14, wherein said connecting steps are carried out with a conductive adhesive.

20. A method of making a chip-type surge absorber as in claim 14, wherein said step of pouring is carried out with an epoxy resin.

21. A chip-type surge absorber, which comprises:
first and second electrode plates each having an upper and a lower surface;
said first electrode plate having a projection at a center thereof;
said first electrode plate having a first end and a second end;
a first semiconductor surge-absorbing element having an upper and a lower surface;
said upper surface of said first semiconductor surge-absorbing element contacting said lower surface of said second electrode plate and said lower surface of said first semiconductor surge-absorbing element contacting said upper surface of said first end of said first electrode plate;
a third electrode plate having an upper surface and a lower surface;
a sub-unit having second and third semiconductor surge-absorbing elements;
said second and said third semiconductor surge-absorbing elements each having an upper and a lower surface;
said lower surface of said second semiconductor surge-absorbing element contacting said upper surface of said second end of said first electrode plate;
said upper surface of said third semiconductor surge-absorbing element connecting to said upper surface of said second electrode plate;
a resin body covering said first, said second, and said third semiconductor surge-absorbing elements;
said second and said third electrode plates each having an exposed portion extending outside said resin body;
said projection having a portion extending outside said resin body; and said second semiconductor surge-absorbing element and said third semiconductor surge-absorbing element being in a sandwich arrangement with said third electrode plate interposed between said second semiconductor surge-absorbing element and said third semiconductor surge-absorbing element.

22. A multiple-element surge absorber, which comprises:

a resin body;

a first electrode having a first end projecting outside said resin body;

said first electrode being positioned for use as a first contact;

a first surge-absorbing element having an upper surface contacting a second end of said first electrode;

a second electrode having a first end projecting outside said resin body;

said second electrode being positioned for use as a second contact;

a second surge-absorbing element having an upper surface contacting a second end of said second electrode;

a third electrode having a first end contacting a lower surface of said first surge-absorbing element;

said third electrode having a second end contacting a lower surface of said second surge-absorbing element;

an intermediate portion of said third electrode projecting outside said resin body; and said intermediate portion being positioned for use as a third contact.

23. A multiple-element surge absorber as in claim 22, further comprising:

a third surge-absorbing element having a lower surface contacting said second end of said second electrode; and said third surge-absorbing element having an upper surface connected to said second end of said first electrode.

* * * * *